(12) United States Patent
Tong et al.

(10) Patent No.: US 11,678,495 B2
(45) Date of Patent: Jun. 13, 2023

(54) THREE-DIMENSIONAL STACKED PHASE CHANGE MEMORY AND PREPARATION METHOD THEREOF

(71) Applicant: HUAZHONG UNIVERSITY OF SCIENCE AND TECHNOLOGY, Hubei (CN)

(72) Inventors: Hao Tong, Hubei (CN); Wang Cai, Hubei (CN); Xiangshui Miao, Hubei (CN)

(73) Assignee: HUAZHONG UNIVERSITY OF SCIENCE AND TECHNOLOGY, Hubei (CN)

( * ) Notice: Subject to any disclaimer, the term of this patent is extended or adjusted under 35 U.S.C. 154(b) by 484 days.

(21) Appl. No.: 17/043,672

(22) PCT Filed: Sep. 23, 2019

(86) PCT No.: PCT/CN2019/107182
§ 371 (c)(1),
(2) Date: Sep. 30, 2020

(87) PCT Pub. No.: WO2021/042422
PCT Pub. Date: Mar. 11, 2021

(65) Prior Publication Data
US 2022/0271089 A1    Aug. 25, 2022

(30) Foreign Application Priority Data
Sep. 3, 2019    (CN) .......................... 201910828704.0

(51) Int. Cl.
*H10B 63/00*    (2023.01)
*H10N 70/00*    (2023.01)
*H10N 70/20*    (2023.01)

(52) U.S. Cl.
CPC .......... *H10B 63/845* (2023.02); *H10N 70/023* (2023.02); *H10N 70/231* (2023.02);
(Continued)

(58) Field of Classification Search
CPC ...... H10B 63/845; H10B 63/80; H10B 63/84; H10N 70/023; H10N 70/231;
(Continued)

(56) References Cited

U.S. PATENT DOCUMENTS

| 2012/0147649 A1* | 6/2012 | Samachisa | G11C 13/0002 257/E21.645 |
| 2013/0229846 A1* | 9/2013 | Chien | H10N 70/023 365/51 |

(Continued)

FOREIGN PATENT DOCUMENTS

| CN | 107068858 | 8/2017 |
| CN | 109524543 | 3/2019 |

(Continued)

OTHER PUBLICATIONS

"International Search Report (Form PCT/ISA/210)" of PCT/CN2019/107182, dated Jun. 3, 2020, pp. 1-5.

(Continued)

*Primary Examiner* — Jerome Leboeuf
(74) *Attorney, Agent, or Firm* — JCIP Global Inc.

(57) ABSTRACT

The disclosure belongs to the technical field of microelectronic devices and memories, and discloses a three-dimensional stacked phase change memory and a preparation method thereof. The preparation method includes: preparing a multilayer structure in which horizontal electrode layers and insulating layers are alternately stacked, then performing etching to form trenches and separated three-dimensional strip electrodes, next filling the trenches with an insulating medium, and then forming small holes at the (Continued)

boundary region between the three-dimensional strip electrodes and the insulating medium, thereafter sequentially depositing a phase change material on the walls of the small holes, and filling the small holes with an electrode material to prepare vertical electrodes, so as to obtain a three-dimensional stacked phase change memory stacked in multiple layers. By improving the overall process of the preparation method, the disclosure realizes the establishment of a three-dimensional phase change memory array by using a vertical electrode structure.

14 Claims, 3 Drawing Sheets

(52) U.S. Cl.
 CPC ....... *H10N 70/841* (2023.02); *H10N 70/8825* (2023.02); *H10N 70/8828* (2023.02); *H10N 70/823* (2023.02); *H10N 70/826* (2023.02)

(58) Field of Classification Search
 CPC ............. H10N 70/841; H10N 70/8825; H10N 70/8828; H10N 70/823; H10N 70/826; H10N 70/011
 See application file for complete search history.

(56) References Cited

U.S. PATENT DOCUMENTS

| 2019/0198569 A1* | 6/2019 | Hsu | G11C 13/0004 |
| 2021/0280782 A1* | 9/2021 | Ahn | H10N 70/231 |

FOREIGN PATENT DOCUMENTS

| CN | 110021622 | 7/2019 |
| KR | 101511871 | 4/2015 |

OTHER PUBLICATIONS

"Written Opinion of the International Searching Authority (Form PCT/ISA/237)" of PCT/CN2019/107182, dated Jun. 3, 2020, pp. 1-4.

* cited by examiner

THREE-DIMENSIONAL STACKED PHASE CHANGE MEMORY AND PREPARATION METHOD THEREOF

CROSS-REFERENCE TO RELATED APPLICATION

This application is a 371 of international application of PCT application serial no. PCT/CN2019/107182, filed on Sep. 23, 2019, which claims the priority benefit of China application no. 201910828704.0, filed on Sep. 3, 2019. The entirety of each of the above mentioned patent applications is hereby incorporated by reference herein and made a part of this specification.

BACKGROUND

Field of the Disclosure

The disclosure relates to the technical field of microelectronic devices and memories, and more specifically, relates to a three-dimensional stacked phase change memory and a preparation method thereof.

Description of Related Art

The continuous increase of total amount of data makes it necessary to set higher requirement for read and write speed, total capacity, work energy consumption and stability of the memory of a computer. The size of existing DRAM has reached the technical limit of manufacturing ability, and the influence of various micro-effects becomes more obvious in the process of size reduction. Therefore, the conventional DRAM technology faces difficulties in many aspects. In order to expand computer memory, a new type of memory, which is a non-volatile memory, has served as an alternative. Flash memory is the mainstream non-volatile memory available on the market today, and the data stored in it will not be lost in the event of a sudden power failure. However, the shortcomings of flash memory are also obvious, including slow read and write speed, fewer number of times for repeated erasing and writing, and high manufacturing costs. In addition, due to the physical limitations for CMOS process devices, after the device size is reduced, the gate oxide layer is too thin, and consequently tunnel leakage current will occur. Because of the advantages of non-volatile memory and the shortcomings of existing flash memory, the industry is working on developing a new generation of non-volatile memory NVM that has the advantages of both DRAM and flash memory. Some new types of non-volatile memory have been gradually developed in recent years. The next generation of non-volatile memory NVM technologies that have received the most attention mainly include: phase change memory PCRAM, magnetic random memory MRAM, ferroelectric random memory FeRAM, resistive random memory RRAM, etc. In particular, as one of the most important memory technologies of new generation, the phase change memory has exhibited significant advantages in terms of its product capacity, storage density, process dimension, stability, read and write performance, erasing and writing life, device power consumption and so on. In addition to non-destructive reading, service life, non-volatility and erasing speed, PCRAM also has other competitive advantages such as multi-value storage, compatibility with existing processes, and being scaled down with the development of process technology.

The phase change memory and the resistive memory both use the difference between the high and low resistance states of materials to store data. However, the phase change memory is different from the resistive memory in that the phase change memory uses the difference between resistance states of the phase change materials in the crystalline state (low resistance state) and the amorphous state (high resistance state), and the memory mainly uses the resistance state difference caused by the formation and rupture of the conductive filaments. Also, in the operation method, the phase change memory operates amplitude and pulse width of positive pulse to perform SET (low and long pulse) and RESET (high and short pulse) operations, whereas the resistive memory uses positive and negative pulses to perform SET and RESET operations. Therefore, the phase change memory and the resistive memory are inherently different from each other. Accordingly, there are different standards adopted for the design of their device structures. For the phase change memory, in order to suppress the influence of leakage current, it is usually necessary to utilize additional selector devices for coordination.

As a new type of memory that is most likely to develop into one of the mainstream memories in the future, the phase change memory has gradually developed to three dimensions in order to meet the high-capacity storage requirements of the era of big data, forming a multilayer stacked three-dimensional phase change memory. However, as a new technology, there are inevitably many problems to be solved for PCRAM.

Unlike the flash memory and the resistive memory, after years of research, their process structures in the aspect of three-dimensional stacking have reached a mature level. At present, the three-dimensional stacked phase change memory is formed simply by stacking upward vertically based on horizontal electrode cross point array structure. Although the structure of stacking is simple, as the number of stacked layers increases, the process steps are complex, and the process cost rises sharply due to the linear increase in the photolithography steps. Moreover, the surface unevenness is aggravated, which brings reliability problems. In addition, the feature size of the memory cell is restricted by the advanced photolithography process. While the cell size is limited, it is very difficult to make the cell size smaller. In brief, there is no favorable factor for further multi-layer stacking and high-density integration. In the vertical structure, the series connection of the phase change unit and the selector is in the horizontal direction, which requires additional multiple processes to be performed for support. Also, as compared with the structure that does not include the selector, under the condition that all the parameters are the same, the storage density will be reduced to a certain extent.

SUMMARY OF THE DISCLOSURE

In view of the above shortcomings or improvement requirements for the related art, the purpose of the disclosure is to provide a three-dimensional stacked phase change memory and a preparation method thereof, wherein by improving the overall process of the preparation method, it is possible to utilize the vertical electrode structure to establish a three-dimensional phase change storage array. As compared with the related art, the disclosure can effectively solve the problem encountered by the existing three-dimensional stacked phase change memory devices in the preparation process, namely, complex multi-layer stacking steps, difficulty in process implementation, and dimensional scaling-down of the unit. The disclosure adopts the cross structure of horizontal electrodes and vertical electrodes so as to realize multi-layer stacking in the vertical direction, a small feature size of the phase change unit and a relatively flat surface, which is conducive to the stacking of more layers, and be conducive to reduce the operating current for phase change of the unit and reduce power consumption. The preparation process is simplified, the requirement for the photolithography process is reduced, and the production cost is decreased.

To achieve the above purpose, according to one aspect of the disclosure, a method for preparing a three-dimensional stacked phase change memory is provided, which is characterized in that it includes the following steps.

(S1) A substrate is prepared, the upper surface of the substrate is used as the base surface, an entire layer of an electrode material is deposited on the substrate as a first horizontal electrode layer, and then a first insulating layer is prepared on the first horizontal electrode layer. Specifically, the projection of the first insulating layer on the plane where the substrate surface is located is within the projection of the first horizontal electrode layer, and at least along a certain linear direction in the plane where the substrate surface is located, the projection length of the first insulating layer is smaller than the projection length of the first horizontal electrode layer, so that the first horizontal electrode layer expose the pins and is not completely covered by the first insulating layer, thereby forming the first horizontal electrode layer and the first insulating layer provided to match the first horizontal electrode layer.

(S2) The uppermost insulating layer is used as the base surface, the operations of depositing the electrode material and preparing the insulating layer are repeated, thereby forming a three-dimensional stacked structure composed of a total of i horizontal electrode layers and a total of i insulating layers respectively provided to match each horizontal electrode layer. The three-dimensional stacked structure is a multilayer structure as a whole.

Specifically, i is a positive integer≥2.

(S3) The multilayer structure is etched to partially expose the substrate and produce trenches, thereby obtaining several three-dimensional strip electrodes that are separated from each other and arranged in strips. Any one of the three-dimensional strip electrodes includes i horizontal electrode layers and i insulating layers, and one of the trenches is provided between any two adjacent three-dimensional strip electrodes.

(S4) The trenches are filled with an insulating medium to achieve electrical and thermal isolation in the horizontal direction.

(S5) The projection lines of the interfaces between the three-dimensional strip electrodes and the insulating medium on the plane where the substrate surface is located are used as a reference, the region at the boundary between the three-dimensional strip electrodes and the insulating medium is etched, thereby obtaining a number of small holes separated from each other. The bottom of any one of the small holes is located below the upper surface of the substrate, and the projection center point of each small hole on the plane where the substrate surface is located is on the projection lines.

(S6) A phase change material is deposited on the hole walls of the small holes obtained in the step (S5) and the phase change material covers the bottoms of the small holes, and then an electrode material is filled in regions of the small holes surrounded by the phase change material to prepare vertical electrodes, thereby obtaining a three-dimensional stacked phase change memory stacked in multiple layers.

More preferably, in the step (S3), the width of each three-dimensional strip electrode is kept equal to each other, the width of each trench is also kept equal to each other, and the width of any trench is equal to the width of any three-dimensional strip electrode.

More preferably, in the step (S5), N small holes which are evenly distributed with each other are correspondingly etched on any one of the interfaces between the three-dimensional strip electrodes and the insulating medium. Moreover, for any two of the interfaces, a one to one correspondence is between the positions of the small holes on one interface and the positions of the small holes on another interface. The connection line of the projection center points of the small holes at the same corresponding position on the plane where the substrate surface is located is perpendicular to the projection line of the interface on the plane where the substrate surface is located.

More preferably, the total number of the three-dimensional strip electrodes obtained in the step (S3) is M, and the total number of the small holes is $2 \times (M-1) \times N$.

More preferably, in the step (S6), the deposited phase change material has a self-selecting effect.

More preferably, the electrode material adopted in the horizontal electrode layer and the electrode material adopted in the vertical electrode are both low work function conductive materials with a work function lower than that of the phase change material. Preferably, the electrode material adopted in the horizontal electrode layer and the electrode material adopted in the vertical electrode include one or more materials below: the following low work function conductive materials Cr, Ag, Al, Ti, W, Ni, Mo, Fe, oxide conductive materials thereof, nitride conductive materials thereof, and N-type silicon.

More preferably, in the step (S6), the deposited phase change material is any one selected from GeTe, SbTe, BiTe, SnTe, AsTe, GeSe, SbSe, BiSe, SnSe, AsSe, InSe, GeSbTe and AgInSbTe, or a mixture formed by doping any one of the above compounds with elements S, C, N, O, Cu, Si, As, B, Al, or Au, or a superlattice structure formed by any several compounds selected from the above compounds.

According to another aspect of the disclosure, the disclosure provides a three-dimensional stacked phase change memory prepared by using the above-mentioned method for preparing a three-dimensional stacked phase change memory.

Compared with the related art, the above technical solutions conceived in the disclosure can achieve advantageous effects as specifically analyzed below.

The existing three-dimensional phase change memory mainly adopts a crossed horizontal electrode structure for three-dimensional stacking. The bottom electrode (word line), insulating layer, selector layer, phase change memory layer, upper electrode (bit line), etc. are deposited layer by layer (the upper electrode and the bottom electrode are electrodes perpendicular to each other in the horizontal direction, the selector material and the phase change material are located at the intersection of the two electrodes). Then the above steps are repeated to achieve multi-layer stacking. This method may adopt the original preparation method for planar phase change memory to achieve three-dimensional stacking, and integration may be achieved by continuously depositing the selector material and the phase change storage material. This approach requires photolithography as a prerequisite for the deposition of each layer of the selector material and the phase change storage material. In the process of three-dimensional stacking, the number of photolithography is proportional to the number of three-dimensional stacking layers. When the number of stacked layers increases, the process cost will increase sharply due to the linear increase in the number of photolithography. And, due to the use of photolithography process, the unevenness of the surface will also increase with the number of layers, which causes serious reliability problems to the device.

The three-dimensional stacked phase change memory cell structure and the preparation method thereof in the disclosure adopt a vertical electrode structure, and the size of the feature size of the memory cell is determined by the thickness of the horizontal electrode film and the aperture size of the vertical electrode (the feature size represents the smaller part of the contact area of the phase change memory cell and the electrodes at both ends, and thus in the vertical structure, the size of the feature size is the contact part of the vertical electrode and the horizontal electrode, and the area is the thickness of the horizontal electrode×the arc length of the contact surface). Therefore, as compared with the phase change region which mainly requires photolithography process in the horizontal structure, the size of the phase change region of the disclosure is smaller, the operating current is small, and the power consumption is low, which is more conducive to the integration of the memory cell (the feature size of the disclosure is small which represents that the phase change region is small, the required energy is also small, the corresponding operating current is also small, and the power consumption is low; in addition, the small phase change region means that high-density integration can be achieved). In terms of the preparation process, the uneven surface caused by multi-layer stacking has little impact, which is beneficial to stacking of layers at a higher level (when performing multi-layer stacking, if the horizontal stacking method in the related art is adopted, there will be a height difference formed between the material of each layer, resulting in uneven surface, and polishing is required to ensure the surface flatness; and as for the vertical stacking method used in the disclosure, since deposited films are used for stacking of layers at a higher level, the unevenness problem is small, which makes it easier to stack layers at a higher level), simplify the preparation process, reduce the requirement for photolithography, and decrease the manufacturing cost. In the memory production process, the cost of the photolithography process accounts for a large part of the cost. Therefore, the reduction of the photolithography process in the process design will reduce the cost for the production process. By adopting vertical electrode structure in the disclosure, there is no need to perform photolithography for each layer for patterning. Instead, after the multilayer structure is deposited, the entire structure is etched for patterning, so it is possible to save a lot of photolithography steps and reduce production costs.

In the disclosure, the first step is to prepare a multi-layer structure in which horizontal electrode layers and insulating layers are alternately stacked on a substrate. Each horizontal electrode layer is matched with the insulating layer disposed right above. Each horizontal electrode layer exposes pins. The multi-layer structure may include a total of i horizontal electrode layers and a total of i insulating layers, wherein i is a positive integer≥2. Taking i=2 as an example, when forming the second horizontal electrode layer and the second insulating layer, the first insulating layer is used as the base surface, an entire layer of an electrode material is deposited as the second horizontal electrode layer, and then the second insulating layer is prepared on the second horizontal electrode layer. Specifically, the projection of the second insulating layer on the plane where the substrate surface is located is within the projection of the second horizontal electrode layer, and at least along a certain linear direction in the plane where the substrate surface is located, the projection length of the second insulating layer is smaller than the projection length of the second horizontal electrode layer, such that the second horizontal electrode layer expose the pins and is not completely covered by the second insulating layer, thereby forming the second horizontal electrode layer and the second insulating layer matched with the second horizontal electrode layer. When i>2, the above process may be repeated. After obtaining the multi-layer structure with the desired number of layers, etching is performed to obtain several three-dimensional strip electrodes that are separated from each other and arranged in strips.

During the preparation process, taking the three-dimensional strip electrode at the middle (not the three-dimensional strip electrodes on the edge of both sides) as an example, the small holes formed by etching should be at the boundary between the horizontal electrode and the two adjacent insulating layers in horizontal left-right direction. At the boundary between each of the three-dimensional strip electrodes and the insulating medium, it is preferable that N small holes may be disposed evenly (the projection center points on the plane where the substrate surface is located of these N small holes are evenly distributed along a projection line of the interface on the said plane). Each small hole corresponds to a phase change memory cell, which is located at the boundary between side walls of the horizontal electrode and the vertical electrode. When the total number of small holes is 2×(M−1)×N, the total number of phase change memory cells is 2×(M−1)×N, wherein M is a positive integer greater than or equal to 2, and N is a positive integer greater than or equal to 1 (considering that there is only one interface in contact with the insulating medium for each of the strip electrodes on outermost two sides, it is implemented that the total number of the three-dimensional strip electrodes is parameter M, and specifically M−1 in the calculation formula for the total number of small holes).

In order to make the obtained phase change unit have a self-selecting effect, the disclosure may be achieved by making the deposited phase change material have a self-selecting effect. For example, doped GeTe and doped GeSbTe, etc. may be adopted as the phase change material. Also, the self-selecting effect may be achieved by adopting metal-semiconductor contact. For example, the selectable conductive electrode material includes one or more materials below: the following low work function conductive materials Cr, Ag, Al, Ti, W, Ni, Mo, Fe, oxide conductive materials thereof, nitride conductive materials thereof, N-type silicon, two-dimensional materials of some metal phase or other conductive materials with low work function (low work function materials refer to materials of which the work function is lower than that of phase change materials). In the related art, the metal-semiconductor contact mostly uses phase change materials and N-type polysilicon or other doped materials to form a pn junction. Therefore, according to the conventional technical means, it is necessary to deposit another layer of material to form a Schottky potential barrier to form a selector device. In the disclosure, a conductive material with a smaller work function is selected as the conductive material (that is, an electrode material with a Fermi energy level higher than that of the phase change material), thereby a potential barrier is formed, that is, a Schottky potential barrier is formed between the phase change material and the said conductive material to achieve the self-selecting effect.

In addition, for the phase change memory with self-selecting effect obtained by the disclosure, no matter whether it is obtained by using the phase change material with self-selecting effect or by using metal-semiconductor contact to realize the self-selecting effect, the correspondingly obtained phase change memory with self-selecting effect can reduce the requirement for selector materials. Accordingly, it is possible to reduce the deposition of a layer of material in the horizontal direction, such that the device structure can be simplified without affecting the performance of device.

Unlike the case that memory cells are formed only at one side of the horizontal electrode with the vertical electrodes (or the horizontal electrode passes between the vertical electrodes for crossing), the disclosure can improve the storage density by arranging vertical electrodes at both sides of the horizontal electrode.

And, since the phase change process of the phase change material is a thermal-induced phenomenon, the arrangement of the selector is essential. Without the presence of the selector, it is very likely that the phase change materials of different units will be crystallized when the current flows and leakage current will occur. In the case that the selector is arranged, the current will be limited to the part of the memory cells that is expected to be selected, and the other part that is not selected will not be affected since the current will not pass therethrough due to the high resistance state. However, it is difficult to add a selector in the horizontal direction. The selectors need to be distributed on each horizontal electrode while cannot be provided on the insulating layer between the layers. Generally speaking, in the related art, a part of the horizontal electrode that is exposed is oxidized first, and then the oxide layer is removed to form a cavity. Thereafter, the selector material is filled in the cavity, and then the unnecessary part of the selector material is removed by using some means to leave the part of the selector material in contact with the horizontal electrode and the vertical electrode. However, the above process requires complex steps, and since the selector material is in direct contact with the phase change material, it is difficult to solve the problem that the selector material and the phase change material are diffused into each other (like phase change material, currently most of the selector materials integrated with the phase change material are chalcogenide compounds). The disclosure uses the electrodes with low work function to contact the phase change material to form a Schottky potential barrier, which is used as a selector device, thereby solving the problem that it is difficult to prepare a selector device in a horizontal direction.

In summary, the disclosure realizes a three-dimensional stacked phase change memory device with vertical electrodes, and simplifies the manufacturing process. The disclosure adopts a vertical electrode structure, adjusts the longitudinal phase change memory cell to the horizontal phase change memory cell, thereby significantly reducing the feature size of the phase change unit, being beneficial to reduce the operating current of the phase change unit, and reducing the power consumption. Moreover, the disclosure simplifies the manufacturing process and reduces the photolithography steps. Accordingly, it is possible to realize multi-layer stacking in the vertical direction while reducing the manufacturing cost.

BRIEF DESCRIPTION OF THE DRAWINGS

FIG. 1 is a schematic view of sequentially depositing electrodes and insulating layers on a substrate.

FIG. 2 is a schematic view of forming trenches by etching on a multilayer electrode structure.

FIG. 3 is a schematic view of filling an insulating medium in a trench formed by etching for electrical and thermal insulation in the horizontal direction.

FIG. 4 is a schematic view of forming small holes by etching at the boundary between the electrodes and the insulating medium.

FIG. 5 is a schematic view of depositing a phase change material in the small holes to form a phase change functional layer.

FIG. 6 is a schematic view of filling an electrode material in the small holes to form vertical electrodes.

Figure 1:
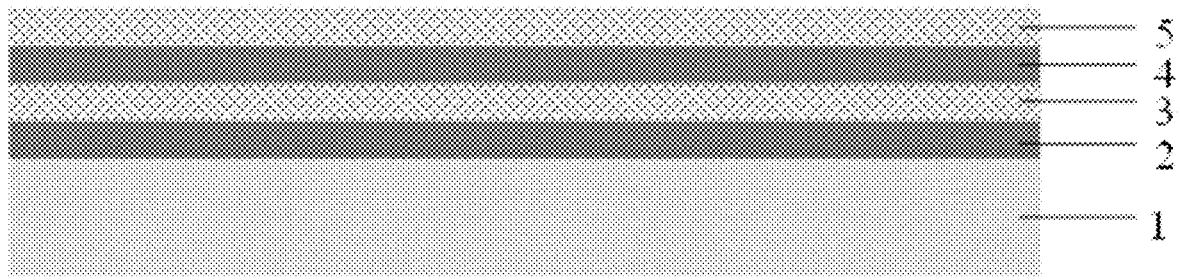
FIG. 1 to FIG. 6 are schematic cross-sectional views of the preparation process flow of the two-layer stack in the three-dimensional stacked phase change memory along a direction perpendicular to the horizontal electrode direction in an embodiment of the disclosure.

The denotation of the reference signs in the figures are as follows: 1 denotes substrate (such as a single crystal silicon substrate with a $SiO_2$ insulating layer on its surface), 2 denotes first electrode layer, 3 denotes first insulating layer, 4 denotes second electrode layer, 5 denotes second insulating layer, 6 denotes electric and thermal insulating layer, 7 denotes phase change functional layer, and 8 denotes vertical electrode.

DESCRIPTION OF EMBODIMENTS

In order to make the objectives, technical solutions, and advantages of the present disclosure more comprehensible, the present disclosure are further described in detail below with reference to the accompanying drawings and embodiments. It should be understood that the specific embodiments described here are only used to explain the present disclosure, but not to limit the present disclosure. In addition, the technical features involved in the various embodiments of the present disclosure described below can be combined with each other as long as they do not conflict with each other.

As shown in FIG. 1 to FIG. 6, the disclosure provides a method for preparing a three-dimensional stacked phase change memory, which specifically includes the following steps.

(1) An entire layer of an electrode material is prepared on the substrate as the first horizontal electrode.

(2) A first insulating layer slightly smaller than the first horizontal electrode in a certain direction (such as the length direction or the width direction of the square substrate) is prepared on the entire layer of the first horizontal electrode.

(3) An entire layer of a second horizontal electrode is prepared on the first insulating layer.

(4) On the above structure, an insulating layer slightly smaller than the second horizontal electrode in a certain direction is prepared. For example, a second insulating layer smaller than the second horizontal electrode in the same direction as the first insulating layer is prepared.

(5) If more layers are to be stacked, the above steps are repeated. For example, the steps (1) to (4) are repeated several times in sequence to form multilayer horizontal electrodes.

(6) Etching is performed until reaching the substrate. For example, the multilayer electrodes may be etched regularly to penetrate through the substrate surface, so that the multilayer electrodes are arranged in regular strips, wherein the trenches have the same width as the strip multilayer electrodes.

(7) The trenches produced by etching are filled with an insulating medium for electrical and thermal insulation in the horizontal direction.

(8) Small holes are formed by etching at the boundary between the multilayer electrodes and the insulating medium until reaching the substrate. For example, small holes in regular arrangement may be obtained by etching with the points on the boundary line between the strip multilayer electrodes and the insulating medium as the center, the bottom of the small holes is below the substrate surface.

(9) A phase change material is deposited on the hole walls until reaching the bottom of the small holes.

(10) An electrode material is filled in small holes of the phase change material to prepare a vertical electrode, so as to obtain a phase change memory with a multilayer vertical structure.

The following takes a two-layer stacked memory as an example to describe the disclosure in detail.

Embodiment 1

This embodiment includes the following steps.

Step 1: On the single crystal silicon substrate 1 with a $SiO_2$ insulating layer on its surface, 100 nm of Al is deposited as the first electrode layer 2 through an electron beam evaporation process.

Step 2: On the basis of Step 1, PECVD is performed to deposit 100 nm of $SiO_2$ as the first insulating layer 3 and the first electrode pin layer is exposed.

Step 3: On the basis of Step 2, 100 nm of Al is deposited as the second electrode layer 4 through electron beam evaporation, which is located on the first insulating layer.

Figure 7:
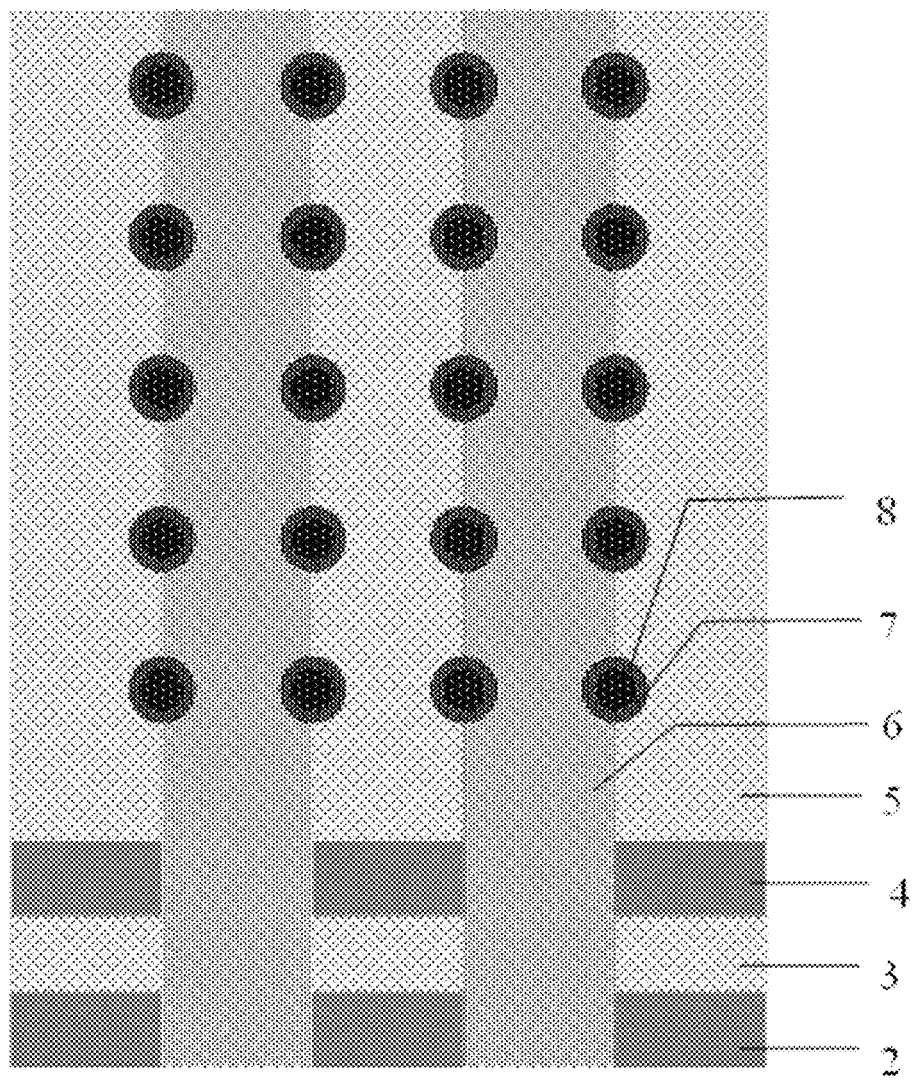
FIG. 7 is a top view after filling the vertical electrodes.

Step 4: On the basis of Step 3, PECVD is performed to grow 100 nm of $SiO_2$ as the second insulating layer 5 and the second electrode pin layer is exposed (as shown in FIG. 1; FIG. 1 does not show the exposed pins. For details on the exposed pins, please refer to FIG. 7).

Figure 2:
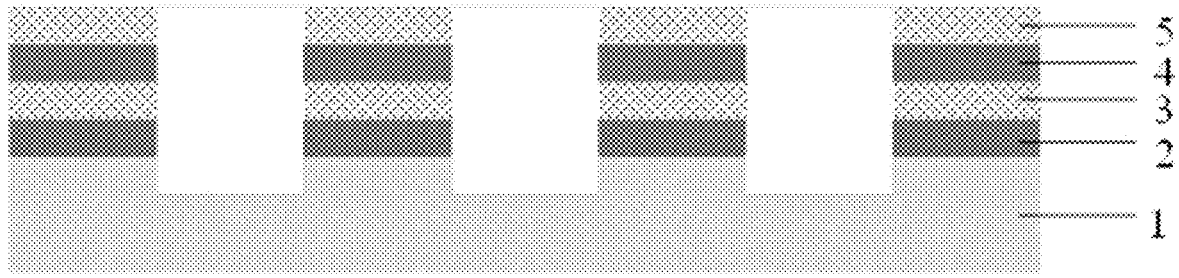
Figure 3:
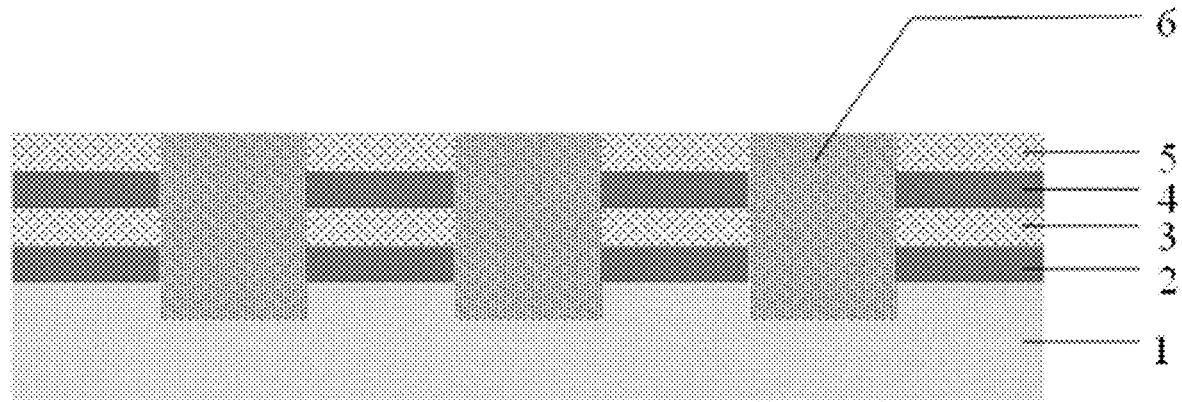

Step 5: The ICP etching equipment is utilized to regularly etch the multilayer electrode structure until reaching the substrate to form strip multilayer electrode structures regularly arranged, as shown in FIG. 2.

Step 6: On the basis of Step 5, the insulating medium $SiO_2$ is filled in the cavities formed by etching, and planarized as the electric and thermal insulation layer 6 in the horizontal direction.

Figure 4:
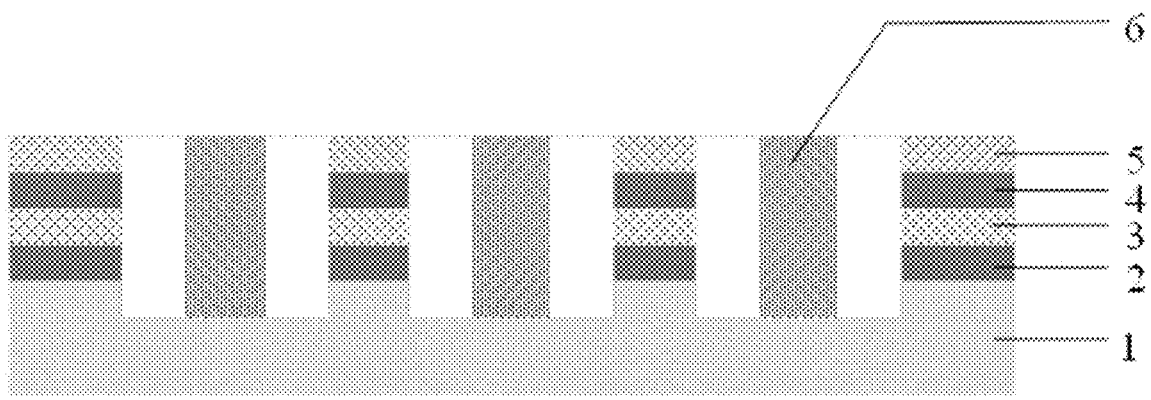
Figure 5:
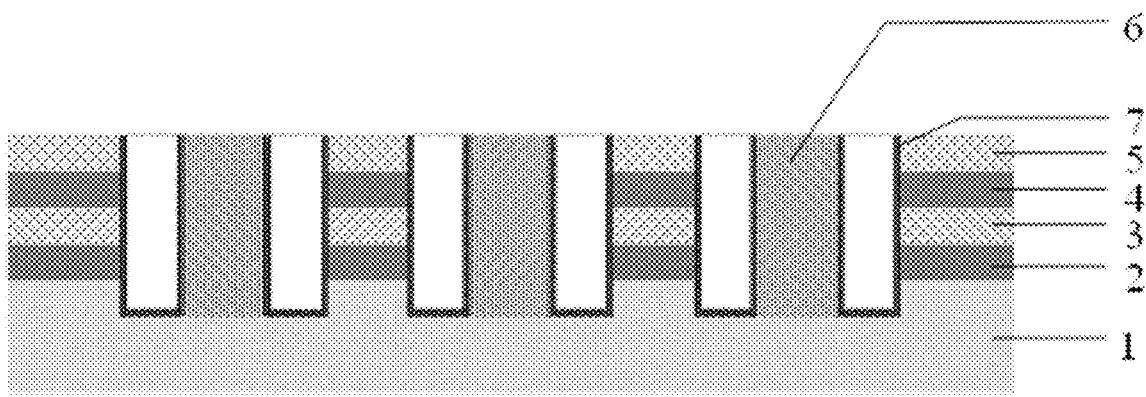
Figure 6:
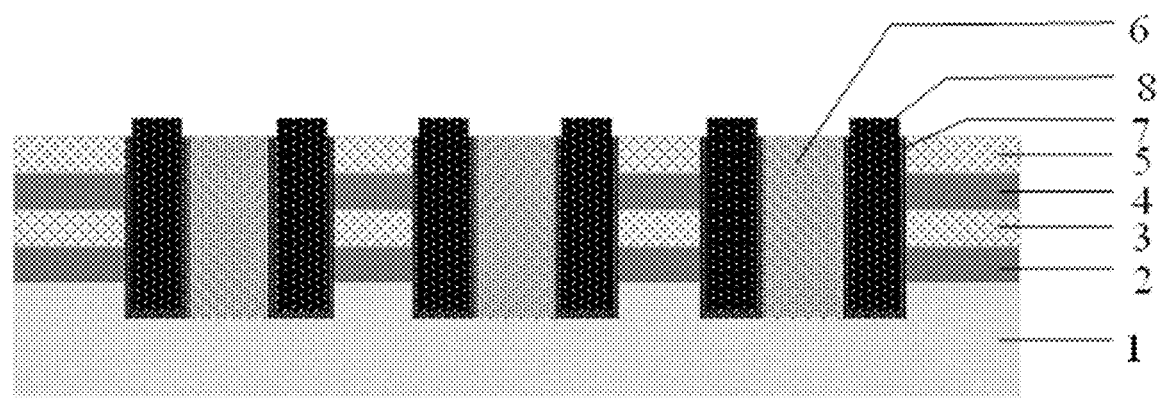

Step 7: Photolithography and etching are performed at the boundary between the strip multilayer electrode structures and the $SiO_2$ insulating medium to obtain small holes arranged regularly. The bottom of the small holes reaches the surface of substrate (as shown in FIG. 4).

Step 8: Atomic layer deposition ALD is performed to deposit 20 nm of $Ge_2Sb_2Te_5$ as the phase change functional layer 7 on the walls of the small holes.

Step 9: Magnetron sputtering is performed to deposit TiW at the centers of the phase change material holes until it is completely filled to form the vertical electrodes 8, as shown in the figure.

The parameters and condition settings, etc. in the above-mentioned embodiment have a good feasibility and are of course only taken as examples. To prepare more stacked layers, the above steps 1 to 4 are repeated.

Those skilled in the art can easily understand that the above descriptions are only preferred embodiments of the present disclosure and are not intended to limit the present disclosure. Any modification, equivalent replacement and improvement, etc. made within the spirit and principle of the present disclosure should fall within the scope of the present disclosure.

What is claimed is:

1. A method for preparing a three-dimensional stacked phase change memory, comprising the following steps:
    (S1) preparing a substrate, using an upper surface of the substrate as a base surface, depositing an entire layer of an electrode material on the substrate as a first horizontal electrode layer, and then preparing a first insulating layer on the first horizontal electrode layer, wherein a projection of the first insulating layer on a plane where a substrate surface is located is within a projection of the first horizontal electrode layer, at least along a linear direction in the plane where the substrate surface is located, a projection length of the first insulating layer is smaller than a projection length of the first horizontal electrode layer, so that the first horizontal electrode layer exposes pins and is not completely covered by the first insulating layer, thereby forming the first horizontal electrode layer and the first insulating layer provided to match the first horizontal electrode layer;
    (S2) using an uppermost insulating layer as the base surface, repeat the operations of depositing the electrode material and preparing the insulating layer, thereby forming a three-dimensional stacked structure composed of a total of i horizontal electrode layers and a total of i insulating layers provided to match each of the horizontal electrode layers respectively, wherein the three-dimensional stacked structure is a multilayer structure;
    wherein, i is a positive integer≥2;
    (S3) etching the multilayer structure to partially expose the substrate and produce trenches, thereby obtaining several three-dimensional strip electrodes that are separated from each other and arranged in strips, wherein any one of the three-dimensional strip electrodes comprises i horizontal electrode layers and i insulating layers, and one of the trenches is provided between any two adjacent three-dimensional strip electrodes;
    (S4) filling the trenches with an insulating medium to achieve electrical and thermal isolation in a horizontal direction;
    (S5) using projection lines of interfaces between the three-dimensional strip electrodes and the insulating medium on the plane where the substrate surface is located as a reference, etching a region at a boundary between the three-dimensional strip electrodes and the insulating medium, thereby obtaining a number of small holes separated from each other, wherein a bottom of any one of the small holes is located below the upper surface of the substrate, and a projection center point of each of the small holes on the plane where the substrate surface is located is on the projection lines;
    (S6) depositing a phase change material on hole walls of the small holes obtained in the step (S5) and making the phase change material cover the bottoms of the small holes, and then filling an electrode material in regions of the small holes surrounded by the phase change material to prepare vertical electrodes, thereby obtaining a three-dimensional stacked phase change memory stacked in multiple layers.

2. The method for preparing the three-dimensional stacked phase change memory according to claim 1, wherein in the step (S3), a width of each of the three-dimensional strip electrodes is equal to each other, a width of each of the trenches is equal to each other, and the width of any one of the trenches is equal to the width of any one of the three-dimensional strip electrodes.

3. The method for preparing the three-dimensional stacked phase change memory according to claim 1, wherein in the step (S5), N small holes that are evenly distributed with each other are correspondingly etched on any one of the interfaces between the three-dimensional strip electrodes and the insulating medium, and for any two of the interfaces, a one to one correspondence is between positions of the small holes on one interface and positions of the small holes on another interface, a connection line of the projection center points of the small holes at the same corresponding position on the plane where the substrate surface is located is perpendicular to the projection lines of the interfaces on the plane where the substrate surface is located.

4. The method for preparing the three-dimensional stacked phase change memory according to claim 3, wherein a total number of the three-dimensional strip electrodes obtained in the step (S3) is M, and a total number of the small holes is $2 \times (M-1) \times N$.

5. The method for preparing the three-dimensional stacked phase change memory according to claim 1, wherein in the step (S6), the deposited phase change material has a self-selection effect.

6. The method for preparing the three-dimensional stacked phase change memory according to claim 1, wherein an electrode material adopted in the horizontal electrode layer and an electrode material adopted in the vertical electrode are both low work function conductive materials with a work function lower than that of the phase change material, the electrode material adopted in the horizontal electrode layer and the electrode material adopted in the vertical electrode include one or more materials below: the following low work function conductive materials Cr, Ag, Al, Ti, W, Ni, Mo, Fe, oxide conductive materials thereof, nitride conductive materials thereof, and N-type silicon.

7. The method for preparing the three-dimensional stacked phase change memory according to claim 1, wherein in the step (S6), the deposited phase change material is any one selected from GeTe, SbTe, BiTe, SnTe, AsTe, GeSe, SbSe, BiSe, SnSe, AsSe, InSe, GeSbTe and AgInSbTe, or a mixture formed by doping any one of the above compounds with elements S, C, N, O, Cu, Si, As, B, Al, or Au, or a superlattice structure formed by any several compounds selected from the above compounds.

8. A three-dimensional stacked phase change memory prepared by using the method for preparing the three-dimensional stacked phase change memory according to claim 1.

9. A three-dimensional stacked phase change memory prepared by using the method for preparing the three-dimensional stacked phase change memory according to claim 2.

10. A three-dimensional stacked phase change memory prepared by using the method for preparing the three-dimensional stacked phase change memory according to claim 3.

11. A three-dimensional stacked phase change memory prepared by using the method for preparing the three-dimensional stacked phase change memory according to claim 4.

12. A three-dimensional stacked phase change memory prepared by using the method for preparing the three-dimensional stacked phase change memory according to claim 5.

13. A three-dimensional stacked phase change memory prepared by using the method for preparing the three-dimensional stacked phase change memory according to claim 6.

14. A three-dimensional stacked phase change memory prepared by using the method for preparing the three-dimensional stacked phase change memory according to claim 7.

* * * * *